(12) United States Patent
Kang et al.

(10) Patent No.: US 6,320,783 B1
(45) Date of Patent: Nov. 20, 2001

(54) NONVOLATILE FERROELECTRIC MEMORY DEVICE AND CIRCUIT FOR DRIVING THE SAME

(75) Inventors: Hee Bok Kang, Daejeon-si; Jin Gu Kim, Chungcheongbuk-do, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/664,768

(22) Filed: Sep. 19, 2000

(30) Foreign Application Priority Data

Sep. 20, 1999 (KR) .............................................. P99-40474

(51) Int. Cl.[7] ...................................................... G11C 7/00
(52) U.S. Cl. .............. 365/145; 365/230.01; 365/230.06; 365/230.03
(58) Field of Search ............................. 365/145, 230.01, 365/230.03, 230.06, 230.08

(56) References Cited

U.S. PATENT DOCUMENTS

| | | | |
|---|---|---|---|
| 4,873,664 | 10/1989 | Eaton, Jr. ............................ | 365/145 |
| 5,680,344 | 10/1997 | Seyyedy ............................... | 365/145 |
| 5,748,554 | * 5/1998 | Barth et al. ...................... | 365/230.03 |
| 5,894,447 | * 4/1999 | Takashima ........................... | 365/158 |
| 6,125,076 | * 9/2000 | Ishikawa ........................ | 365/230.06 |
| 6,130,843 | * 10/2000 | Lee .................................. | 365/189.05 |
| 6,134,160 | * 10/2000 | Waller et al. ........................ | 365/200 |
| 6,154,399 | * 11/2000 | Ogishima ............................ | 365/200 |
| 6,205,064 | * 3/2001 | Ooishi ................................ | 365/200 |

\* cited by examiner

*Primary Examiner*—Viet Q. Nguyen
(74) *Attorney, Agent, or Firm*—Fleshner & Kim, LLP

(57) ABSTRACT

A nonvolatile ferroelectric memory device and driving circuit for driving the same reduce a device size and increase a device driving capability. The nonvolatile ferroelectric memory device includes first and second cell arrays each having sub cell arrays, a local X decoder that outputs a plurality of driving signals for driving split wordlines in the first and second cell arrays, and a first local wordline driver that selectively applies the driving signals to the first cell array and a second local wordline driver that selectively applies the driving signals to the second cell array. A main wordline driver outputs a first control signal that activates the first local wordline driver and a second control signal that activates the second local wordline.

23 Claims, 12 Drawing Sheets

E : electric field
P : polarity

NONVOLATILE FERROELECTRIC MEMORY DEVICE AND CIRCUIT FOR DRIVING THE SAME

BACKGROUND OF THE INVENTION

1. Field of the Invention

The present invention relates to a semiconductor memory device, and more particularly, to a nonvolatile ferroelectric memory device and circuit for driving the same.

2. Background of the Related Art

Generally, a nonvolatile ferroelectric memory, i.e., a ferroelectric random access memory A (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

The reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

FIG. 4 illustrates a block diagram of a related art nonvolatile ferroelectric memory. As shown in FIG. 4, the related art nonvolatile ferroelectric memory is provided with a main wordline driver 41, a first cell array 43 on one side of the main wordline driver 41, a first local wordline driver 45 on one side of the first cell array 43, a second local wordline driver 47 on one side of the first local wordline driver 45 and a second cell array 49 on one side of the second local wordline driver 47. A first local X decoder 51 is formed over the first local wordline driver 45, and a second local X decoder 53 formed over the second local wordline driver 47. The first local wordline driver 45 is adapted to receive a signal from the main wordline driver 41 and a signal from the first local X decoder 51 and selects a wordline for the first cell array unit 43. The second local wordline driver 47 is adapted to receive a signal from the main wordline driver 41 and a signal from the second local X decoder 53 and selects a wordline for the second cell array 49. The related art nonvolatile ferroelectric memory provides a signal from the main wordline driver 41 both to the first and second local wordline drivers 45 and 47. Therefore, one of the first and second cell arrays 43 and 49 is selected depending on signals from the first local X decoder 51 and the second local X decoder 53. That is, either the first cell array 43 or the second cell array 49 is selected, and a wordline of the selected cell array is driven depending on signals from the first and second local X decoders 51 and 53.

FIG. 5 is a diagram that illustrates selection of one of the cell arrays depending on signals from the first and second local X decoders 51, 53 of FIG. 4. As shown in FIG. 5, the main wordline connected to the main wordline driver 41 is formed across the first and second local wordline drivers 45 and 47 and the first and second cell arrays 43 and 49.

The first local wordline driver 45 is a NAND logic gate 55 for subjecting a signal from the main wordline driver 41 received through the main wordline and a signal from the first local X decoder 51 to an logical operation. An output of the logic gate 55, the NAND gate, is dependent on signals from the first and second local X decoders 51 and 53 regardless of the signal provided from the main wordline driver 41. For example, if it is assumed that a high signal is provided from the main wordline driver 41, the first cell array 43 is selected if a signal from the first local X decoder 51 is low and a signal from the second local X decoder 53 is high. Opposite to this, if a signal from the first local X decoder 51 is high and a signal from the second local X decoder 53 is low, the second cell array 49 is selected.

The second local wordline driver also includes a NAND gate 55 for subjecting a signal from the main wordline driver 41 received through the main wordline and a signal from the second local X decoder 53 to a logical operation. Thus, selection of either of the first and second cell arrays is dependent on the signals from the first and second local X decoders 51 and 53. As described above, the circuits for driving a nonvolatile ferroelectric memory shown in FIGS. 4 and 5 are limited portions. Thus, there are a plurality of first and second local wordline drivers 45 and 47, the first and second cell arrays 43 and 49, and first and second local X decoders 51 and 53.

As described above, the related art circuit for driving a nonvolatile ferroelectric memory has various disadvantages. The two local X decoders required for selection of either one of the left or right cell array occupy a large area. Such an area increase to accommodate the two local X decoders, even if the area should become smaller according to the trend of high density device packing, causes delays that drop an access speed and deteriorate a driving performance. Further, an increase in chip size is not favorable for device packing or cost.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter. Another object of the present invention is to provide a circuit for driving a memory that substantially obviates one or more problems due to limitations and disadvantages of the related art.

Another object of the present invention is to provide a circuit for driving a nonvolatile ferroelectric memory that can reduce a chip size.

Another object of the present invention is to provide a circuit for driving a nonvolatile ferroelectric memory that can increase a device driving capability.

Another object of the present invention is to provide a circuit for driving a nonvolatile ferroelectric memory that has an increased access speed.

Another object of the present invention is to provide a circuit for driving a nonvolatile ferroelectric memory that can stably and accurately select a cell array.

Another object of the present invention is to provide a circuit for driving a nonvolatile ferroelectric memory that can reduce a device size, increase a device driving capability and increase data sensing accuracy.

To achieve at least these objects and other advantages in a whole or in part and in accordance with the purpose of the present invention, as embodied and broadly described, a memory device of the present invention includes first and second cell arrays constituted with plural sub cell arrays, a local X decoder that outputs a driving signal for driving the first and second cell arrays, a first local wordline driver that selectively applies the driving signal from the local X decoder to the first cell array, a second local wordline driver that selectively applies the driving signal from the local X decoder to the second cell array, and a main wordline driver that outputs a first control signal that determines whether the first local wordline driver is activated or not and second control signal that determines whether the second local wordline is activated or not.

To further achieve the above objects in a whole or in parts, there is provided a nonvolatile ferroelectric memory device according to the present invention that includes a first memory array and a second memory array each having a plurality of cell arrays, a first local wordline driver that selectively provides a driving signal for cells in the first memory array, a second local wordline driver that selectively provides the driving signal for cells in the second memory array, a main wordline driver that provides a control signal to enable one of the first local wordline driver unit and the second local wordline driver, and a local decoder that provides the driving signal to the first and second local wordline drivers for selected cells in the first and second memory arrays.

To further achieve the above objects in a whole or in parts, there is provided a driving circuit for a memory device according to the present invention that includes a main wordline driver that outputs first and second control signals, a local decoder that outputs a plurality of driving signals and first and second local wordline drivers to drive a selected split wordline pair of a plurality of split wordline pairs of corresponding cell array, wherein each local wordline driver includes a plurality of first switches that switch a corresponding one of the control signals of the main wordline driver, a plurality of second switches that each switch a corresponding one of the plurality of driving signals, a plurality of pull-down switches each coupled to a corresponding one of the first and second switches and a split wordline, wherein the local wordline drivers drives the selected split wordline pair responsive to the control signals and driving signals.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
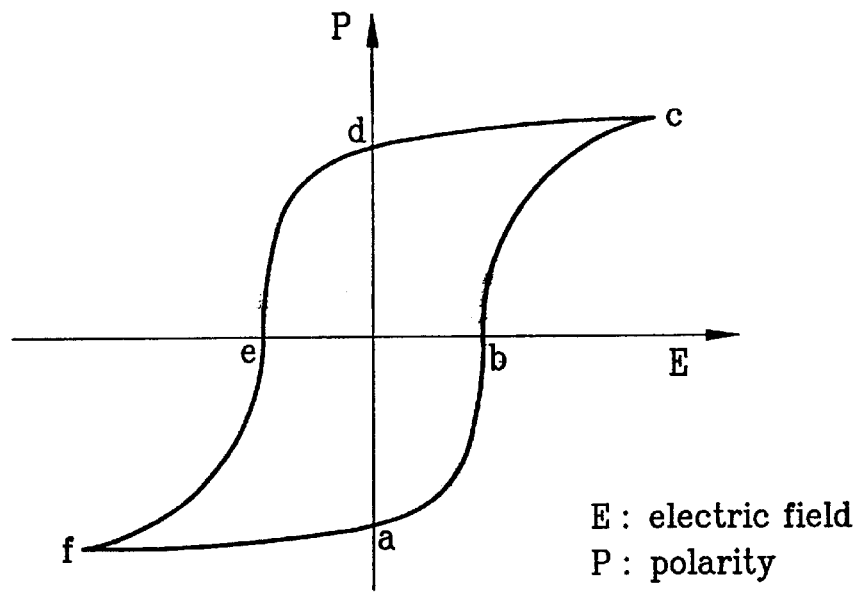
FIG. 1 illustrates a hysteresis loop of a ferroelectric material.
Figure 2:
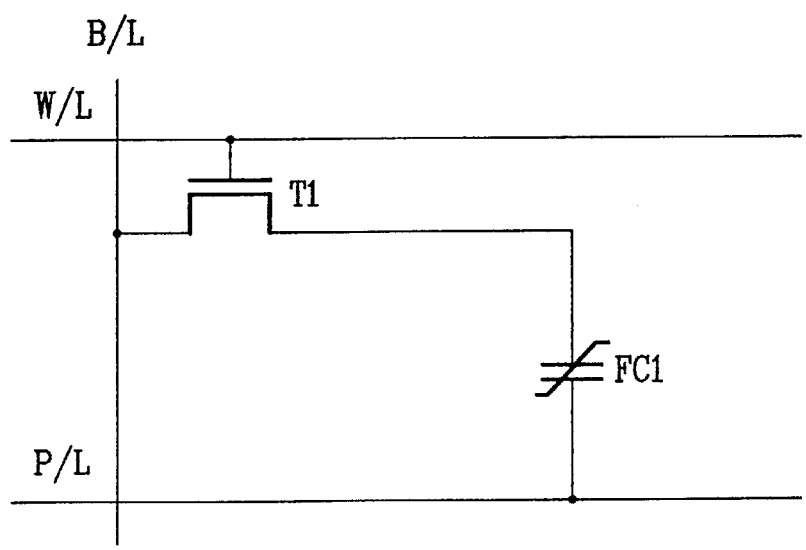
FIG. 2 is a schematic diagram that illustrates an unit cell of a related art non-volatile ferroelectric memory.
Figure 3A:
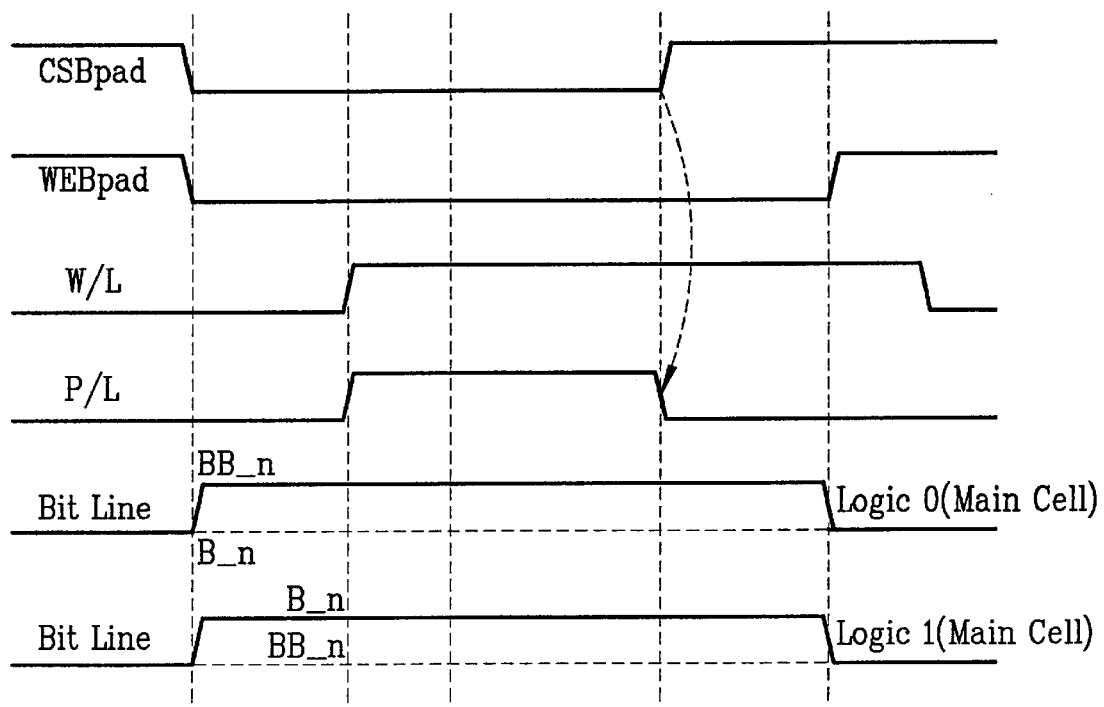
FIG. 3A illustrates a timing diagram of a write mode operation of the related art nonvolatile ferroelectric memory.
Figure 3B:
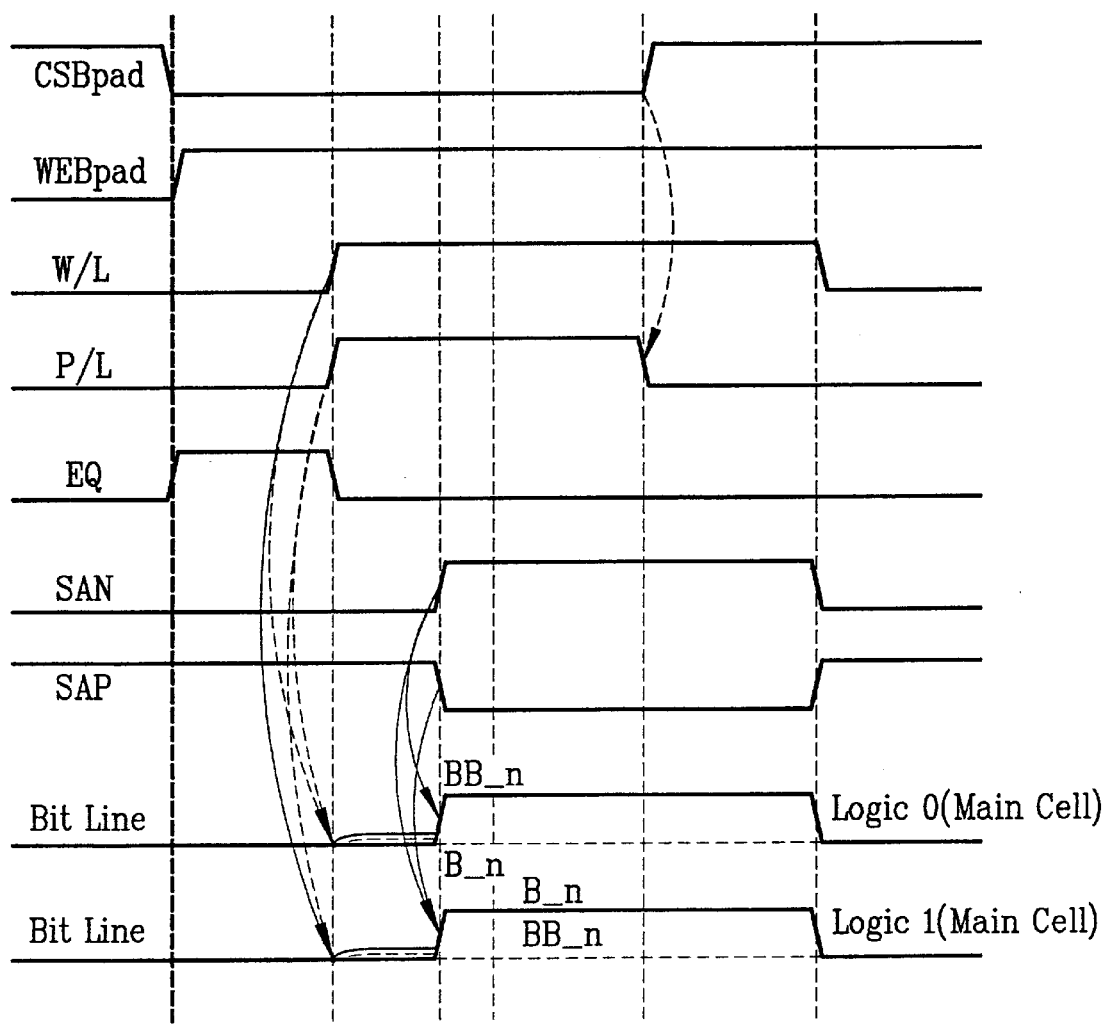
FIG. 3B illustrates a timing diagram of a read mode operation of the related art nonvolatile ferroelectric memory.
Figure 4:
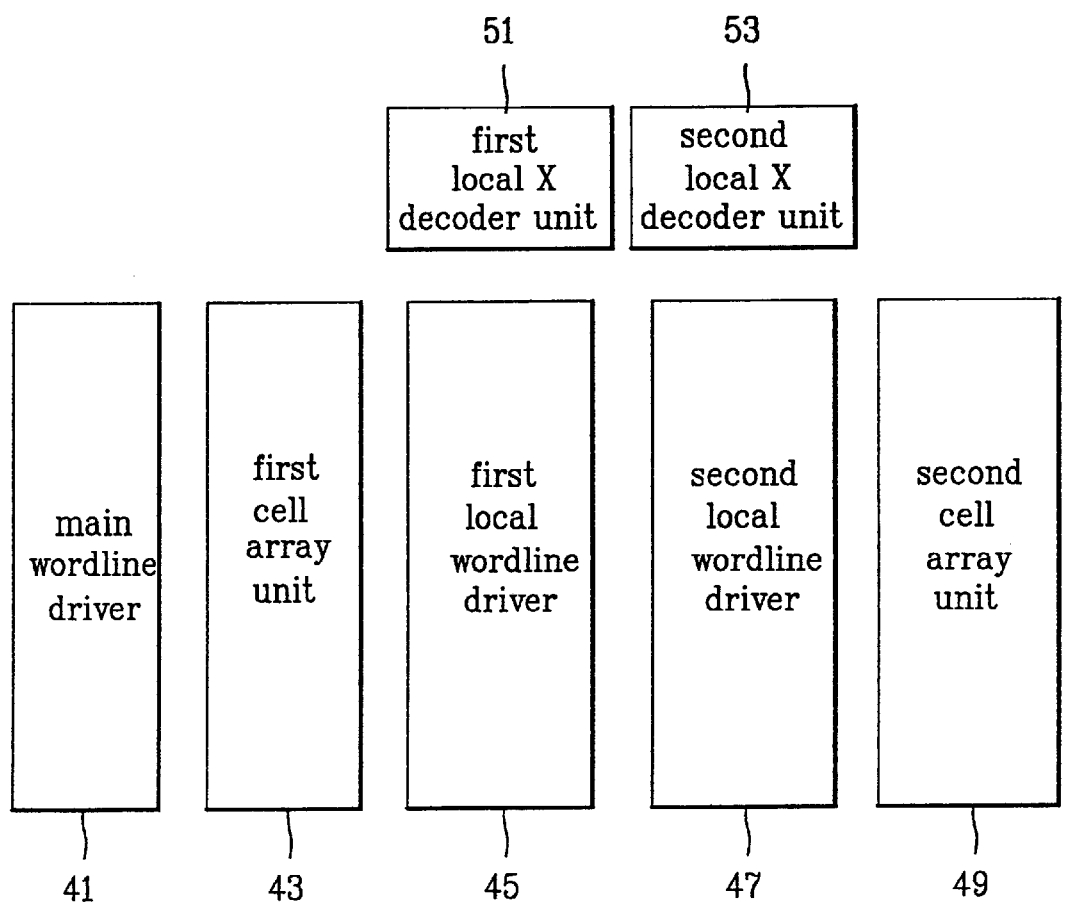
FIG. 4 illustrates a block diagram of a related art non-volatile ferroelectric memory.
Figure 5:
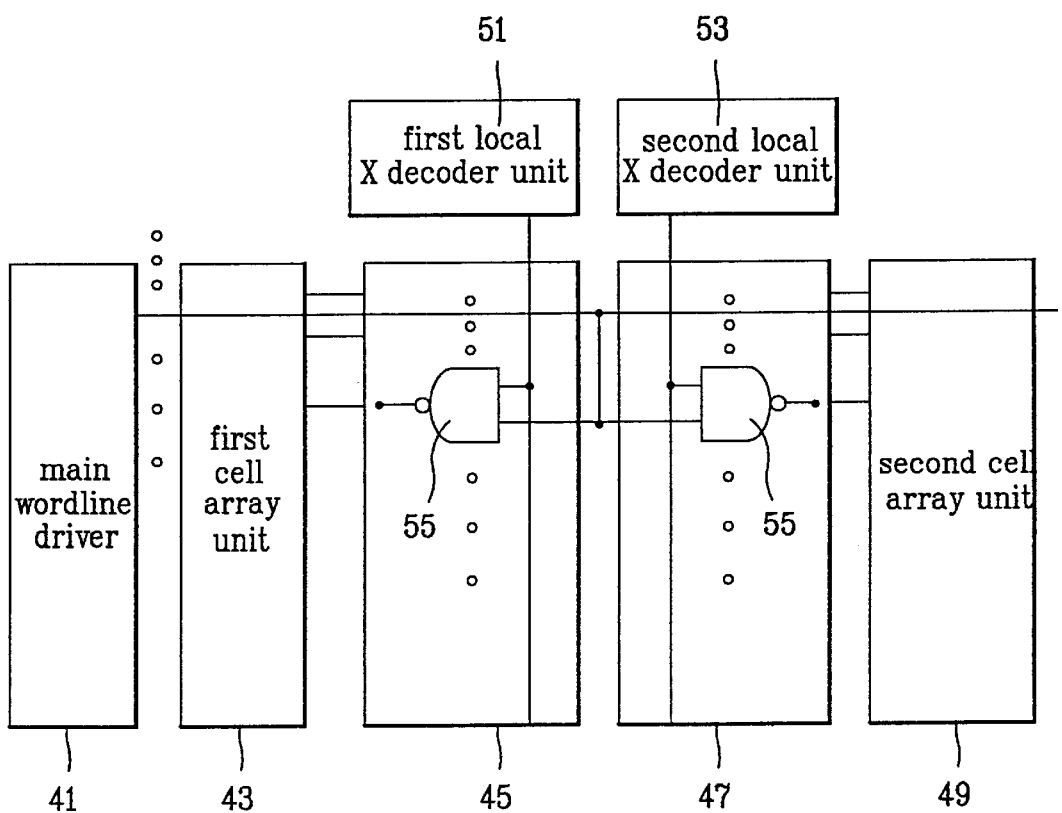
FIG. 5 illustrates a partial detail of a related art nonvolatile ferroelectric memory of FIG. 4.
Figure 6:
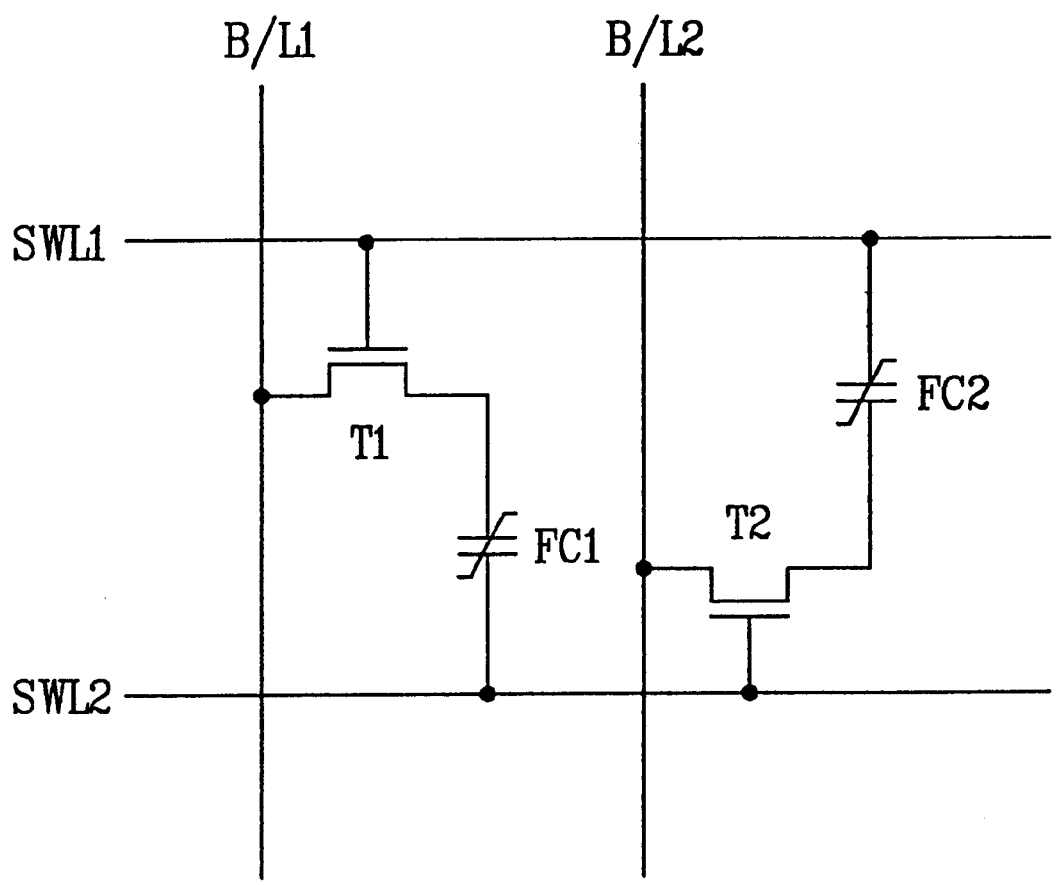
FIG. 6 is a diagram that illustrates a unit cell of a nonvolatile ferroelectric memory according to preferred embodiments of the present invention.

FIG. 6 is a schematic view showing a unit cell of a nonvolatile ferroelectric memory device according to preferred embodiments of the present invention. As shown in FIG. 6, a unit cell of the nonvolatile ferroelectric memory device includes first and second split wordlines SWL1 and SWL2 formed with a prescribed interval in a row direction, and first and second bitlines B/L1 and B/L2 formed across the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B/L2, and a second ferroelectric capacitor FC2 is coupled between a source of the second transistor T2 and the first split wordline SWL1. A plurality of the unit cells make a cell array.

In view of data storage, the unit cell can include a pair of split wordlines, a bitline, a transistor 1T, and a ferroelectric capacitor 1C. In view of data structure the unit cell can also include a pair of split wordlines, two bitlines, two transistors 2Ts, and two ferroelectric capacitors 2FCs.

Figure 7:
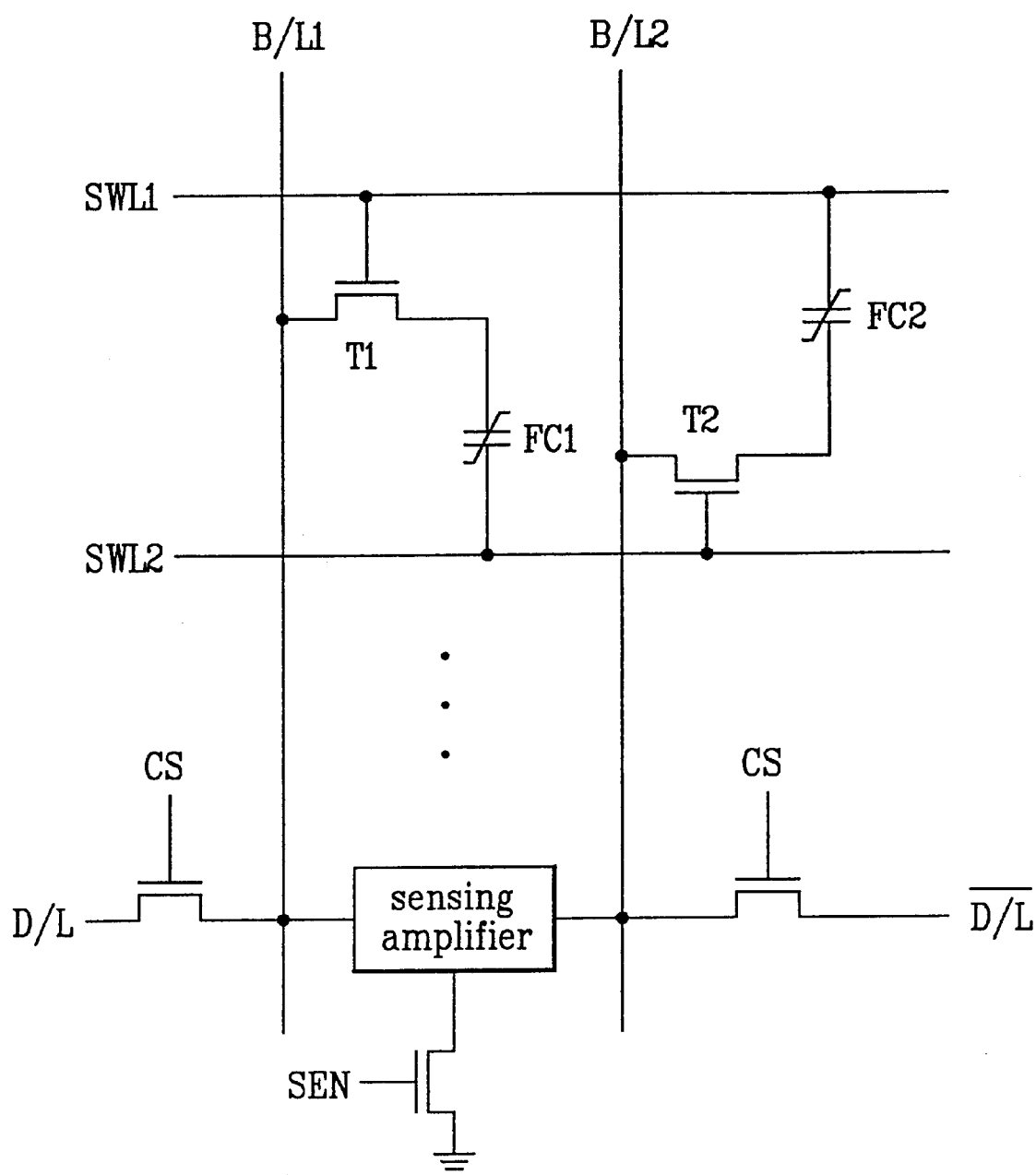
FIG. 7 is a circuit diagram that illustrates a non-volatile ferroelectric memory according to preferred embodiments of the present invention.

FIG. 7 is a circuit diagram showing portions of a non-volatile ferroelectric memory device according to preferred embodiments of the present invention. As shown in FIG. 7, a plurality of split wordline pairs each including first and second split wordlines SWL1 and SWL2 in pairs are preferably formed in row direction. A plurality of bitline pairs B/Ln and B/Ln+1 (e.g., B/L1 and B/L2) are formed across the split wordline pairs. Sensing amplifiers are formed between the respective bitline pairs to sense data transmitted through the bitlines and transfer the sensed data to a data line DL or a data bar line /DL. In addition, a sensing amplifier enable portion (not shown) and a selection switching portion (not shown) are provided. The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 8.

Figure 8:
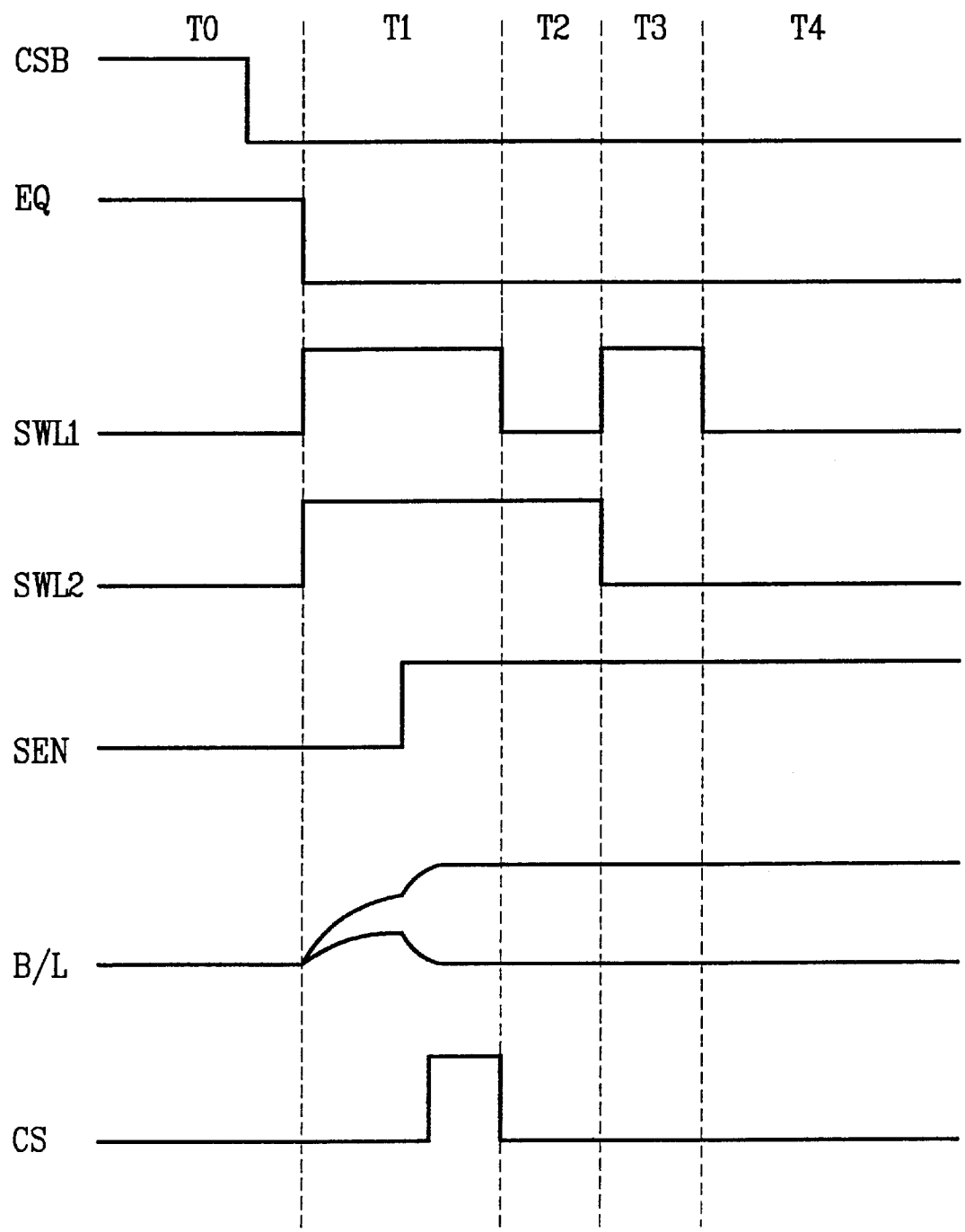
FIG. 8 illustrates a timing diagram showing operations of a nonvolatile ferroelectric memory according to preferred embodiments of the present invention.

A T0 period in FIG. 8 denotes a period before the first split wordline SWL1 and the second split wordline SWL2 are activated to "high (H)". In this T0 period, all of bitlines are preferably precharged at a level.

A T1 period denotes a period that the first and second split wordlines SWL1 and SWL2 are all to become high level "H". In this T1 period, data of the ferroelectric capacitor in the main cell are transmitted to a bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in later T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 9:
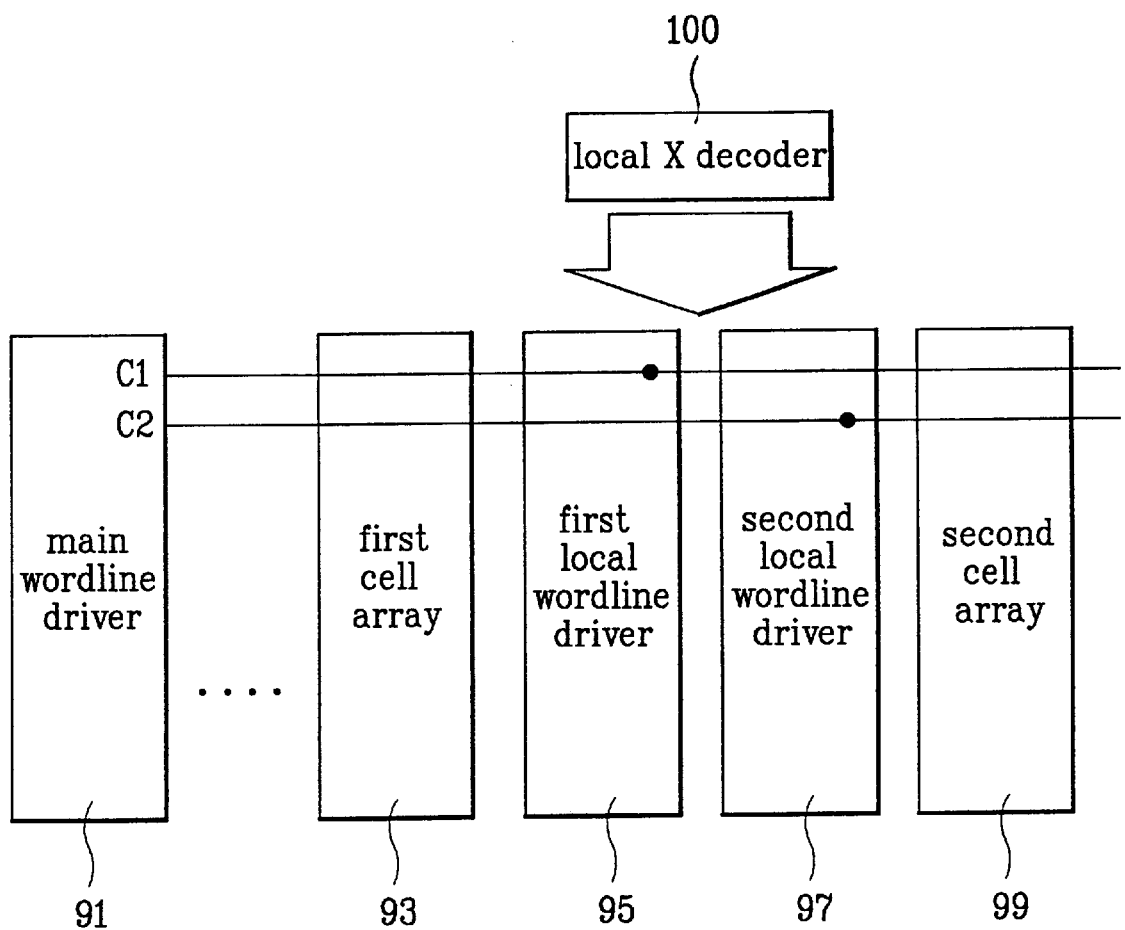
FIG. 9 is a block diagram that shows a preferred embodiment of the nonvolatile ferroelectric memory device according to the present invention.

FIG. 9 illustrates a block diagram showing a first preferred embodiment of nonvolatile ferroelectric memory according to the present invention. As shown in FIG. 9, the first preferred embodiment of the nonvolatile ferroelectric memory of the present invention includes a main wordline driver 91, a first cell array unit 93 on one side of the main wordline driver 91 having a plurality of cell arrays, a first local wordline driver unit 95 on one side of the first cell array 93 having a plurality of local wordline drivers, a second local wordline driver unit 97 on one side of the first local wordline driver unit 95 having a plurality of local wordline drivers and a second cell array unit 99 on one side of the second local wordline driver unit 97 having a plurality of cell arrays. A local X decoder unit 100 is preferably formed nearly nearby (e.g., over or below) the first and second local wordline driver units 95 and 97.

The main wordline driver 91 outputs a first control signal C1, which determines whether the first local wordline driver 95 is activated and a second control signal C2 that determines whether the second local wordline driver 97 is activated. At this time, the first control signal C1 and the second control signal C2 preferably have an opposite phase.

Accordingly, if the first control signal C1 is activated, the second control signal C2 is not activated. Alternatively, if the second control signal C2 is activated or enabled, the first control signal C1 is not activated or enabled.

Each of the first and second cell arrays 93 and 99 include cell arrays or sub cell arrays each having a plurality of unit cells each with 2T/2C. The local X decoder 100 outputs a number of driving signals preferably corresponding to a number of split wordline pairs constituting each cell array. The driving signals are also provided to the first and second local wordline drivers 95 and 97.

The main wordline driver 91 provides at least one control signal that activates one of the first local wordline driver 95 and the second local wordline driver 97. The local wordline driver selected by the main wordline driver 91 is preferably enabled to transfer the driving signal, which is output from the local X decoder 100, to a desired split wordline pair of a desired one of a plurality of cell sub arrays that form the first or second cell array.

Figure 10A:
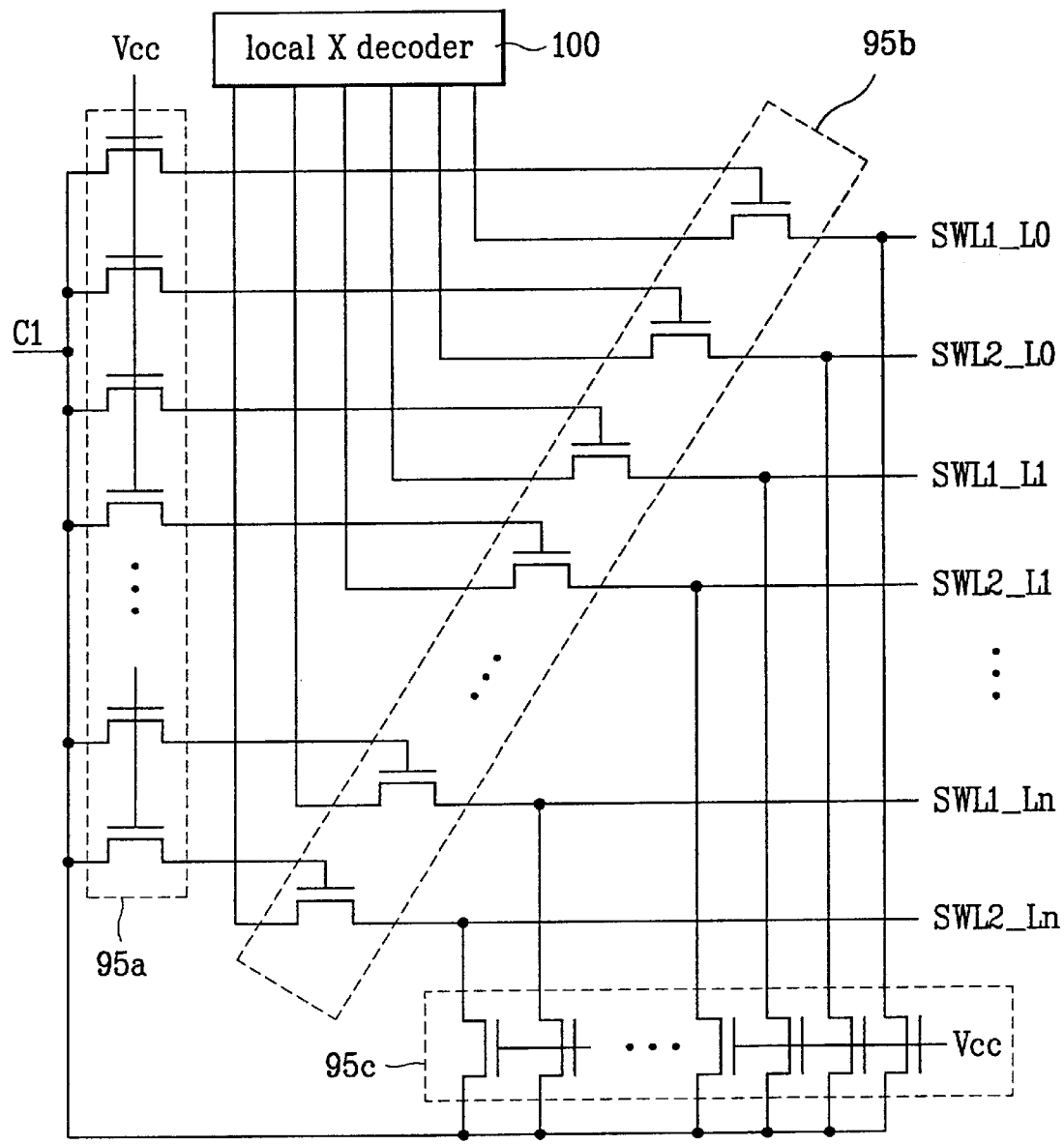
FIG. 10a is a diagram that shows a preferred embodiment of a driving circuit for a nonvolatile ferroelectric memory device according to the present invention.
Figure 10B:
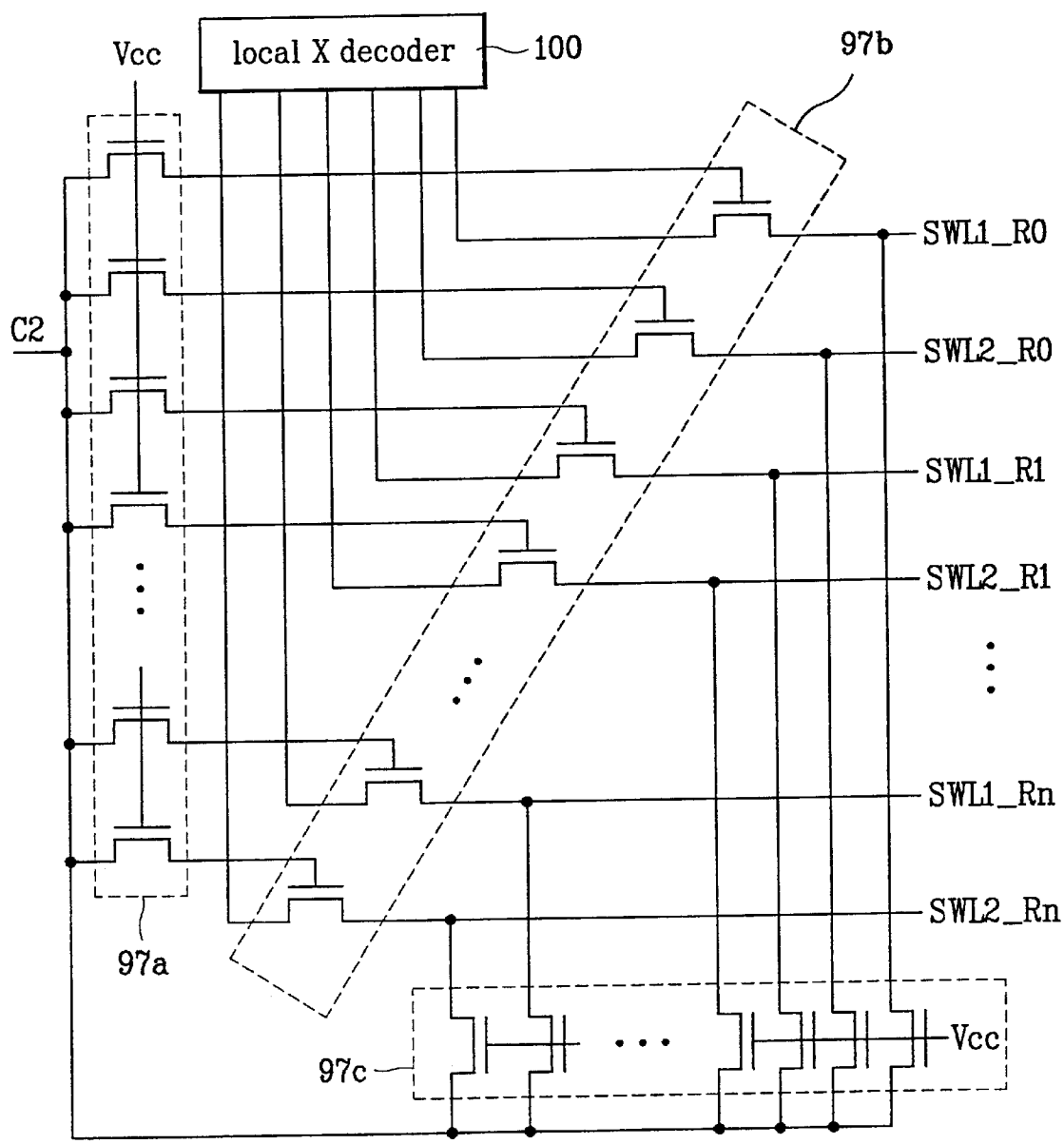
FIG. 10b is a diagram that shows a preferred embodiment of a driving circuit for a nonvolatile ferroelectric memory device according to the present invention.

FIGS. 10a and 10b are diagrams that show a preferred embodiment of a driving circuit of a nonvolatile ferroelectric memory device according to the present invention. FIG. 10a shows one of a plurality of local wordline driver units preferably constituting a first local wordline driver (e.g., the first local wordline driver 95).

As shown in FIG. 10a, the local wordline driver unit includes a first switching portion 95a including a plurality of NMOS transistors coupled with each other in a row direction, having drains that receive a first control signal C1 output from a main wordline driver, a second switching portion 95b and a pull-down portion 95c. The second switching portion 95b includes a plurality of NMOS transistors having gates coupled with sources of the plurality of NMOS transistors constituting the first switching portion 95a and drains applied with a driving signal that is output from a local decoder such as the local X decoder 100. The pull-down portion 95c includes a plurality of NMOS transistors having drains that receive the first control signal C1 that is output from the main wordline driver and sources coupled with sources of the plurality of NMOS transistors constituting the second switching portion 95b. Preferably, sources of the plurality of NMOS transistors constituting the second switching portion 95b have a greater driving capacity and are sequentially coupled to first and second split wordline pairs (SWL1_L0, SWL2_L0, . . . , SWL1_Ln, SWL2_Ln).

Operations of the first local wordline driver according to the preferred embodiment of a driving circuit will now be described. If a first control signal C1 output from the main wordline driver is a low signal, the low signal is transferred to gates of the NMOS transistors constituting the second switching portion 95b through NMOS transistors constituting the first switching portion 95a.

Accordingly, a plurality of NMOS transistors constituting the second switching portion 95b are turned off, and the split wordline pairs are in a floating state since a driving signal, which is output from the local X decoder, cannot be transferred to the split wordline pairs as shown in FIG. 10a. Since drains of NMOS transistors of the pull-down portion 95c first receive the low signal from the main wordline driver, a floating voltage of the split wordline pairs is bypassed toward drains of NMOS transistors of the pull-down portion 95c.

If the first control signal C1 output from the main wordline driver is a high signal, the high signal is transferred to gates of the NMOS transistors of the second switching portion 95b through NMOS transistors of the first switching portion 95a. Accordingly, a plurality of NMOS transistors constituting the second switching portion 95b are turned on to transfer a driving signal output from the local X decoder 100 to the split wordline pairs. Preferably, the local X decoder 100 applies an active signal to any one pair of the split wordline pairs, and an inactive signal to the remaining split wordline pairs.

That is, the local X decoder 100 outputs driving signals to drains of NMOS transistors of the second switching portion 95b and applies an active signal (e.g., a high signal) only to the drains of one pair of NMOS transistors, and applies an inactive signal (e.g., a low signal) to the remaining NMOS transistor pairs.

The high level first control signal C1, which is transferred through the pull-down portion 95c, is transferred to sources of NMOS transistors of the second switching portion 95b, and is output at the local X decoder 100. Accordingly, a high signal is applied to each source of NMOS transistors of the second switching portion 95b, and all of the signals of high level can be applied to the split wordline pairs.

However, a high signal from the local X decoder 100 is applied to drains of only one selected pair of NMOS transistors among the plurality of NMOS transistors of the second switching portion 95b. Since a low signal is applied to the remaining transistors of the second switching portion 95b, the high signal applied to sources of NMOS transistors of the second switching portion 95b through the pull-down portion 95c cannot be applied to the split wordline pairs, but is bypassed toward the local X decoder 100 through NMOS transistors of the second switching portion 95b having drains receiving a low signal.

FIG. 10b is a diagram that illustrates one of a plurality of local wordline driver units forming a second local wordline driver (e.g., the second local wordline driver 97) according to the preferred embodiment of the driving circuit. As shown in FIG. 10b, while the first control signal C1 from the main wordline driver is applied to drains of NMOS transistors constituting the first switching portion 95a and the pull-down portion 95c, a second control signal C2 is applied to drains of NMOS transistors in a first switching portion 97a and a pull-down portion 97c as shown in FIG. 10b.

Further, among first and second cell arrays, a pair of split wordlines (e.g., SWL1_Lx, SWL2_Lx) among the split wordlines (SWL1_L0, SWL2_L0, . . . , SWL1_Ln, SWL2_Ln) is selected within any one sub cell array of a plurality of sub cell arrays constituting the first cell array as shown in FIG. 10a. In addition, a pair of split wordlines is selected within any one sub cell array of a plurality of sub cell arrays constituting the second cell array as shown in FIG. 10b. Operations of the second local wordline driver are similar to the local wordline driver shown in FIG. 10a, and accordingly a detailed description is omitted.

Figure 11:
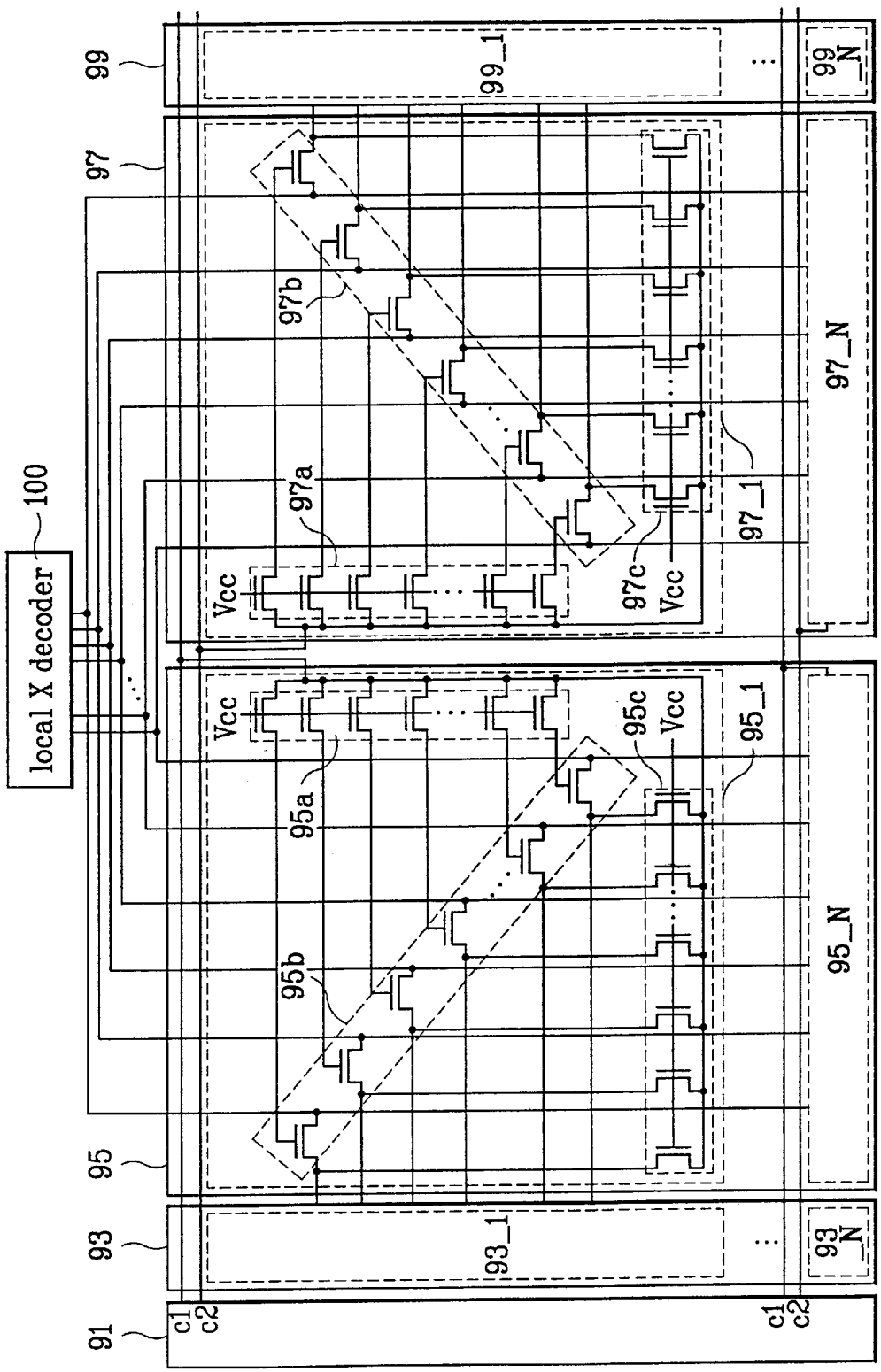
FIG. 11 is a schematic diagram that shows another preferred embodiment of a nonvolatile ferroelectric memory device according to the present invention.

FIG. 11 is a diagram that illustrates a second preferred embodiment of a nonvolatile ferroelectric memory device according to the present invention. As shown in FIG. 11, the second preferred embodiment of the nonvolatile ferroelectric memory device according to the present invention includes a main wordline driver 91 for outputting a first control signal C1 that determines whether the first local wordline driver 95 is activated or not and a second control signal C2 that determines whether the second local wordline driver 97 is activated or not and first and second cell arrays 93 and 99 having a plurality of sub cell arrays (93_1, . . . , 93_N), (99_1, . . . , 99_N) includes a plurality of local wordline drivers 95_1, 95_2, . . . , 95_N are at one side of the first cell array 93. Each local wordline driver preferably includes a first switching portion 95a, a second switching portion 95b and a pull-down portion 95c. The first switching portion 95a is for switching the first control signal C1. The second switching portion 95b is for transferring a driving signal to any one cell sub array within the first cell array 93 according to an output signal of the first switching portion 95a. The first local wordline driver 95 includes the pull-down portion 95c for bypassing a floating voltage of split wordline pairs of a corresponding cell sub array.

A plurality of local wordline drivers 97_1, 97_2, . . . , 97_N are at one side of the first local wordline driver 95. Each local wordline driver preferably includes a first switching portion 97a, a second switching portion 97b and a pull-down portion 97c. The a first switching portion 97a is for switching the second control signal C2. The second switching portion 97b is for transferring a driving signal to any one corresponding cell sub array (99_1, . . . 99_n) within the second cell array 99 according to an output of the first switching portion 97a. The second local wordline driver 97 includes the pull-down portion 97c for bypassing a floating voltage of split wordline pairs of corresponding cell array. A local X decoder 100 is for controlling a driving signal preferably sent to both the first and second local wordline drivers 95 and 97.

Each local wordline driver constituting the first and second wordline drivers 95 and 97 preferably have a similar structure. However, the first local wordline driver 95 is preferably controlled (e.g., enabled) by the first control signal C1, and the second local wordline driver 97 is preferably controlled by the second control signal C2.

The first cell array 93 preferably constitutes an equal number of cell arrays as a number of local wordline drivers constituting the first local wordline drivers 95 and 97.

In the same manner, the second cell array 99 preferably constitutes an equal number of cell arrays as a number of local wordline drivers constituting the second local wordline driver 97.

Each cell array includes a plurality of split wordline pairs and bit lines formed to cross the split wordline pairs. Each split wordline pair and each bitline forms a cell. The first cell array 93 is constituted with a plurality of sub cell arrays 93_1, 93_2 . . . 93_N, and the second cell array is also constituted with a plurality of cell arrays 99_1, 99_2 . . . 99_N.

NMOS transistors constituting the second switching portions 95b and 97b preferably have greater driving capacity than NMOS transistors constituting the first switching portions 95a and 97a, and pull-down portions 95c and 97c. The number of NMOS transistors constituting the first switching portions 95a and 97a, the second switching portions 95b and 97b, and the pull-down portions 95c and 97c is determined according to the number of split wordline pairs. That is, if there are n split wordline pairs in a cell sub array, there are preferably 2n NMOS transistors constituting the first switching portions 95a and 97a, the second switching portions 95b and 97b, and the pull-down portion 95c and 97c.

Operations of the second preferred embodiment of the nonvolatile ferroelectric memory device according to the present invention will be now be described. If a cell to be selected is in the first cell array 93, the main wordline driver 91 outputs the first control signal C1 in a high level, and the second control signal C2 in a low level. The first local wordline driver 95 is activated and transfers a driving signal from the local X decoder 100 to a corresponding split wordline pair of a corresponding cell sub array in the first cell array 93. The driving signal from the local X decoder 100 to the second local wordline driver is not transferred to the split wordlines.

If a cell to be selected is in the second cell array 99, the main wordline driver 91 outputs the second control signal C1 in a high level, and the first control signal C2 in a low level. Accordingly, the second local wordline driver 97 is activated and transfers a driving signal from the local X decoder 100 to a corresponding split wordline pair of a corresponding cell array in the second cell array 99.

For example, if the first control signal C1 from the main wordline driver 91 is a high signal, a corresponding local wordline driver (95_1, . . . , 95_N) in the first local wordline driver 95 is activated. That is, the first control signal C1 is transferred to drains of NMOS transistors constituting the first switching portion 95a of the corresponding local wordline driver in the first local wordline driver 95. Since the NMOS transistors constituting the first switching portion 95a are always on by a power voltage $V_{cc}$, a high level first control signal is transferred to each gate of the NMOS transistors constituting the second switching portion 95b via the first switching portion 95a. In addition, the high level first control signal is also transferred to drains of the NMOS transistors constituting the pull-down portion 95c.

If NMOS transistors constituting the second switching portion 95b are turned on by a high signal transferred to gates thereof, a driving signal from the local X decoder 100 is transferred toward sources of the NMOS transistors of the second switching portion 95b. The local X decoder 100 outputs a high signal only to a pair of split wordlines, and outputs a low signal to the remaining pairs. Accordingly, the first control signal C1 passed through the pull-down portion 95c NMOS transistors is bypassed to the local X decoder 100 outputting the low signals.

Thus, any one pair of the plurality of NMOS transistors constituting the second switching portion 95b transfers the high signal to the corresponding split wordline, and the remaining NMOS transistors bypass the high signal transferred through the pull-down portion 95c to the local X decoder 100.

If the first control signal C1 is a low signal, the second local wordline driver 97 is activated by the high level second control signal C2, and a desired cell is selected in the same manner described above for the first local wordline driver 95.

If the first control signal C1 is a low signal, split wordline pairs coupled with the inactive first local wordline driver 95 moves into a floating state. That is, the first control signal C1 of low level is transferred to gates of NMOS transistors constituting the second switching portion 95b through NMOS transistors of the first switching portion 95a.

Accordingly, the NMOS transistors constituting the second switching portion 95b are maintained disabled, and since the first control C1 low signal is transferred to drains of NMOS transistors constituting the pull-down portion 95c, the floating voltage of the split wordline pairs is bypassed through each NMOS transistor of the pull-down portion 95c. Thus, the floating voltage may be preferably bypassed using the pull-down portion 95c when split wordline pairs of a non-selected cell sub array are in floating state.

As described above, preferred embodiments of a driving circuit and a nonvolatile ferroelectric memory and methods for using same according to the present invention have various advantages. The selection of either one of the left and right side cell array units by the control signal from the main wordline driver, which allows provision of only one local decoder unit, can reduce or minimize a chip size because an area occupied by the local decoder unit can be reduced or minimized. Further, a driving capability of the driving circuit in comparison to the chip area allows for a fast access. Local wordline drivers that control the split wordlines can be provided using only NMOS transistors, which can obtain a transmission characteristics having no Vtn drop. Since a local wordline driver is constituted with NMOS transistors only, a chip size can be minimized. However, the present invention is not intended to be limited to NMOS transistors. Further, floating voltages of split wordline pairs of non-selected cell array are bypassed so data sensing accuracy when selecting a cell array can be increased. In addition, an access speed can be increased because of a transferring characteristic with no Vtn drop and an increased driving capacity.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor memory device, comprising:
    a first memory array and a second memory array each having a plurality of cell arrays;
    a first local wordline driver that selectively provides a driving signal for cells in the first memory array;
    a second local wordline driver that selectively provides the driving signal for cells in the second memory array;
    a main wordline driver that provides a control signal to enable one of the first local wordline driver unit and the second local wordline driver; and
    a local decoder that provides a set of signals including the driving signal to the first and second local wordline drivers for selected cells in the first and second memory arrays, and wherein the first and second local wordline drivers receive the same set of signals.

2. The semiconductor memory device of claim 1, wherein the first control signal and the second control signal have opposite phases.

3. The semiconductor memory device of claim 1, wherein the local wordline driver includes a plurality of wordline drivers equal in number to cell arrays constituting the second memory array.

4. The semiconductor memory device of claim 3, wherein the semiconductor memory device is a nonvolatile ferroelectric memory device, and wherein each cell of the cell arrays comprises:
    a first and a second split wordlines extending along one direction at first intervals;
    a first and a second bitlines extending along a second direction to cross the first and second split wordlines at second intervals;
    a first transistor having a second electrode coupled to the first bitline and a control electrode coupled to the first split wordline;
    a first ferroelectric capacitor between a first electrode of the first transistor and the second split wordline;
    a second transistor having a second electrode coupled to the second bitline and a control electrode coupled to the second split wordline; and
    a second ferroelectric capacitor between a first electrode of the second transistor and the first split wordline.

5. The semiconductor memory device of claim 1, wherein the main wordline driver activates at least one of a plurality of wordline drivers constituting the first and second local wordline drivers, wherein each of the wordline drivers provide the driving signal to a plurality of split wordline pairs that extend along one direction to cross a cell array.

6. The semiconductor memory device of claim 5, wherein each of the plurality of wordline drivers comprises:
    first switches that switch the control signal of the main wordline driver;
    second switches controlled by output signals of the first switches that switch the driving signal from the local decoder; and
    third switches between an input terminal of the first switches and an output terminal of the second switches that bypass a floating voltage of the split wordline pairs when the control signal of the main wordline driver is a prescribed level.

7. The semiconductor memory device of claim 6, wherein the first switches are each one of a first plurality of transistors positioned one per row having second electrodes that receive the control signal of the main wordline driver.

8. The semiconductor memory device of claim 6, wherein the second switches are each one of a second plurality of transistors positioned one in each row, having first electrodes coupled to a corresponding wordline, second electrodes that receive a corresponding portion of the driving signal from the local decoder, and control electrodes that receive the output signal of a corresponding one of a first plurality of transistors constituting the first switches.

9. The semiconductor memory device of claim 8, wherein the local decoder outputs the driving signal being a first enable portion and a plurality of second disable portions, wherein the first enable portion is applied to a selected split wordline pair and the second disable portions are applied signals to remaining split wordline pairs.

10. The semiconductor memory device of claim 8, wherein the second plurality of transistors constituting the second switches each have greater driving capacity than the first plurality of transistors constituting the first switches and a third plurality of transistors constituting the third switches.

11. The semiconductor memory device of claim 6, wherein the third switches are pull down switches each constituted with one of a third plurality of transistors, each having second electrodes that each receive the corresponding control signal of the main wordline driver and first electrodes coupled to first electrodes of a corresponding one of a second plurality of transistors constituting the second switches.

12. The semiconductor memory device of claim 6, wherein if the control signal is a high level signal, the first, second and third switches are enabled, and wherein the high level signal control signal that is transferred to an output terminal of the second switches through the third switches is bypassed to the local decoder that applies a low level driving signal to non-selected split wordline pairs.

13. The semiconductor memory device of claim 1, wherein the local decoder applies the driving signal to at least one cell array of the plurality of cell arrays constituting the first and second memory arrays.

14. The semiconductor memory device of claim 1, wherein if the control signal is a high level active signal, the first local wordline driver is enabled and the second local wordline driver is disabled.

15. A driving circuit for a nonvolatile ferroelectric memory device, comprising:
   a main wordline driver that outputs first and second control signals;
   a local decoder that outputs a plurality of driving signals; and
   first and second local wordline drivers to drive a selected split wordline pair of a plurality of split wordline pairs of corresponding cell array, wherein each local wordline driver comprises,
   a plurality of first switches that switch a corresponding one of the control signals of the main wordline driver;
   a plurality of second switches that each switch a corresponding one of the plurality of driving signals;
   a plurality of pull-down switches each coupled to a corresponding one of the first and second switches and a split wordline, wherein the local wordline drivers drives the selected split wordline pair responsive to the control signals and driving signals.

16. The driving circuit of claim 15, wherein the first switches include a plurality of first transistors each having second electrodes that receive the corresponding control signal of the main wordline driver and control electrodes that receive a first prescribed voltage, wherein the second switches include a second plurality of transistors each having second electrodes that receive the corresponding one of the plurality of driving signals and control electrodes coupled with first electrodes of the first transistors, and wherein the pull-down switches include a plurality of third transistors each having second electrodes that receive the corresponding control signal and first electrodes coupled with first electrodes of the second transistors and a split wordline for bypassing a floating voltage of the split wordline when the corresponding control signal of the main wordline driver has a prescribed level.

17. The driving circuit of claim 16, wherein sequential pairs of the plurality of second transistors constituting the second switches are each coupled with each pair of split wordlines.

18. The driving circuit of claim 16, wherein the second transistors of the second switches have greater driving capacity than first and third transistors, and wherein the local decoder outputs an active driving signal for the selected split wordline pair, and wherein the remaining ones of the driving signals are inactive driving signals.

19. The driving circuit of claim 16, wherein the second switches bypass the corresponding control signal at a high level received through the pull-down switches to the local decoder.

20. The driving circuit of claim 17, wherein when there are n split wordline pairs, there are 2n NMOS transistors constituting the first switches, the second switches and the pull-down switches.

21. A nonvolatile ferroelectric memory device, comprising:
   a first memory array and a second memory array each having a plurality of cell arrays;
   a first local wordline driver that selectively provides a driving signal for cells in the first memory array;
   a second local wordline driver that selectively provides the driving signal for cells in the second memory array;
   a main wordline driver that provides a control signal to enable one of the first local wordline driver unit and the second local wordline driver; and
   a local decoder that provides the driving signal to the first and second local wordline drivers for selected cells in the first and second memory arrays, wherein the main wordline driver activates at least one of a plurality of wordline drivers constituting the first and second local wordline drivers, wherein each of the wordline drivers provide the driving signal to a plurality of split wordline pairs that extend along one direction to cross a cell array.

22. Nonvolatile ferroelectric memory device of claim 21, wherein each of the plurality of wordline drivers comprises:
   first switches that switch the control signal of the main wordline driver; and
   second switches controlled by output signals of the first switches that switch the driving signal from the local decoder.

23. The nonvolatile ferroelectric memory device of claim 21, wherein each of the plurality of wordline drivers comprises third switches between an input terminal of the first switches and an output terminal of the second switches that bypass a floating voltage of the split wordline pairs when the control signal of the main wordline driver is a prescribed level.

* * * * *